United States Patent [19]

Ohno et al.

[11] Patent Number: 4,783,424
[45] Date of Patent: Nov. 8, 1988

[54] METHOD OF MAKING A SEMICONDUCTOR DEVICE INVOLVING SIMULTANEOUS CONNECTION AND DISCONNECTION

[75] Inventors: Jun-ichi Ohno, Yokohama; Satoshi Konishi, Tokyo, both of Japan

[73] Assignee: Tokyo Shibaura Denki Kabushiki Kaisha, Kawasaki, Japan

[21] Appl. No.: 834,101

[22] Filed: Feb. 21, 1986

Related U.S. Application Data

[60] Division of Ser. No. 763,088, Aug. 6, 1985, Pat. No. 4,608,668, which is a continuation of Ser. No. 409,613, Aug. 19, 1982, abandoned.

[30] Foreign Application Priority Data

Sep. 3, 1981 [JP] Japan ......................... 138829
Apr. 12, 1982 [JP] Japan ......................... 60537

[51] Int. Cl.⁴ ........................... H01L 21/265
[52] U.S. Cl. ............................. 437/40; 437/174; 437/247; 437/922; 437/51; 148/DIG. 55; 148/DIG. 91
[58] Field of Search ........ 148/1.5, 187, 179, DIG. 91, 148/DIG. 92, DIG. 128, DIG. 55, DIG. 93; 29/571, 576 T, 584, 576 B; 437/173, 174, 922, 40

[56] References Cited

U.S. PATENT DOCUMENTS

| | | | |
|---|---|---|---|
| 4,090,289 | 5/1978 | Dennard et al. | 29/571 |
| 4,138,781 | 2/1979 | Niwa | 29/571 |
| 4,178,674 | 12/1979 | Liu et al. | 29/571 |
| 4,179,310 | 12/1979 | Compton et al. | 148/1.5 |
| 4,240,094 | 12/1980 | Mader | 437/173 |
| 4,268,950 | 5/1981 | Chatterjee et al. | 29/571 |
| 4,292,729 | 10/1981 | Powell | 29/584 |
| 4,330,931 | 5/1982 | Liu | 29/571 |
| 4,339,285 | 7/1982 | Pankove | 437/173 |
| 4,351,674 | 9/1982 | Yoshida et al. | 148/15 |
| 4,387,503 | 6/1983 | Aswell et al. | 437/173 |
| 4,597,162 | 7/1986 | Johnson et al. | 437/174 |

*Primary Examiner*—Brian E. Hearn
*Assistant Examiner*—Kevin McAndrews
*Attorney, Agent, or Firm*—Finnegan, Henderson, Farabow, Garrett & Dunner

[57] ABSTRACT

A semiconductor device comprising a first conductor having first and second portions which are electrically disconnected from each other, and a second conductor, formed on an insulating film separating it from the first conductor, which is electrically conductive. A radiated energy beam renders the second conductor non-conductive, while simultaneously electrically connecting the first and second portions, rendering the first conductor conductive, as needed.

2 Claims, 5 Drawing Sheets

F I G. 1
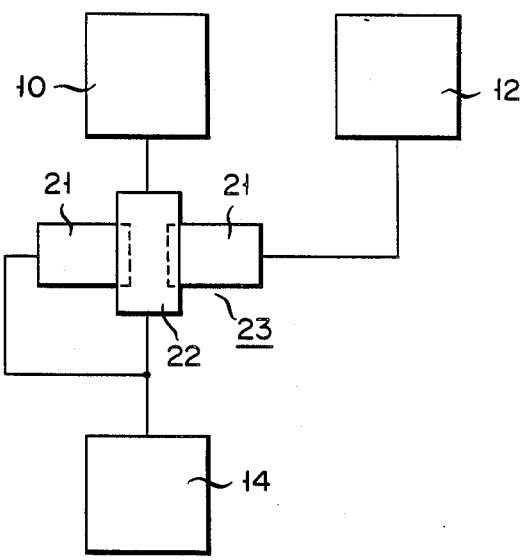
F I G. 2
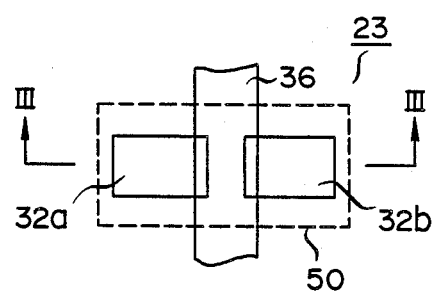
F I G. 3
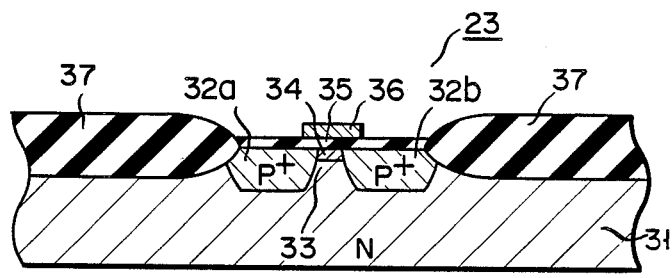

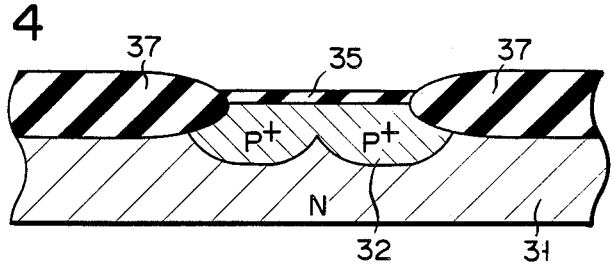
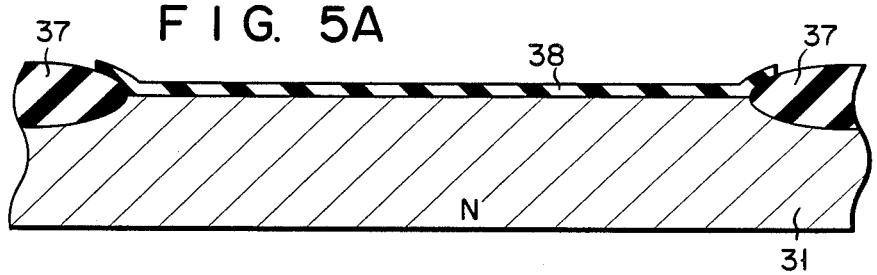
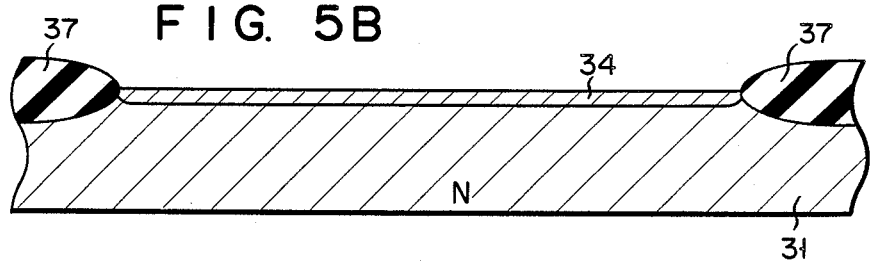
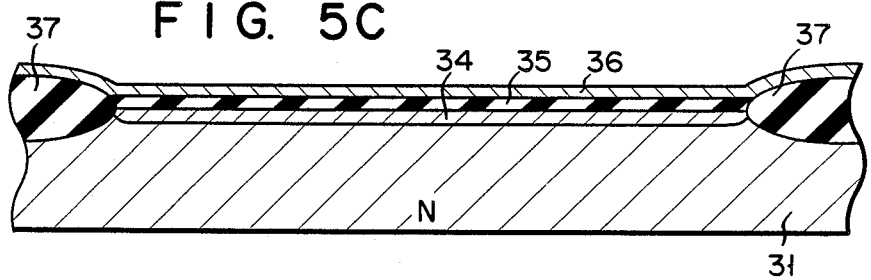
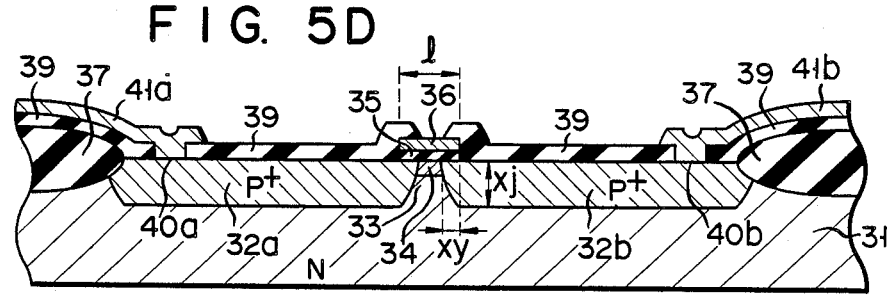

METHOD OF MAKING A SEMICONDUCTOR DEVICE INVOLVING SIMULTANEOUS CONNECTION AND DISCONNECTION

This is a division of application Ser. No. 763,088, filed Aug. 6, 1985, now U.S. Pat. No. 4,608,668 which is a continuation of Ser. No. 409,613, filed Aug. 19, 1982, now abandoned.

BACKGROUND OF THE INVENTION

The present invention relates to a semiconductor device having a switching means for switching conductors.

A semiconductor device having a redundancy function is described in, for example, "HI-CMOSII 4K Static RAM" ISSCC DIGEST OF TECHNICAL PAPERS, PP. 14, 15 and 253, by 0. Minato, T. Masuhara, T. Sasaki and Y. Sakai, Feb. 18, 1981. This semiconductor device has a first fuse connected to a normal memory cell and a second fuse connected to a spare memory cell. If the spare memory cell is used, a laser beam is radiated on the first fuse to electrically disconnect the normal memory cell from the semiconductor device. Further, the laser beam is radiated on the second fuse to electrically connect the spare memory cell to the semiconductor device.

The second fuse has an intrinsic polycrystalline silicon layer and an n+-type diffusion layer formed at both sides of the intrinsic polycrystalline silicon layer. If the laser beam is radiated on the second fuse, an n+-type impurity is diffused into the intrinsic polycrystalline silicon layer to decrease the resistance of the second fuse. As a result, the second fuse is rendered conductive.

As described above, in the conventional semiconductor device, the step of electrically disconnecting the first fuse from the semiconductor device is separated from the step of electrically connecting the second fuse thereto, resulting in a low switching efficiency.

SUMMARY OF THE INVENTION

It is, therefore, an object of the present invention to provide a semiconductor device which switches conductors efficiently.

The semiconductor device according to the present invention has a first conductor electrically disconnected from the semiconductor device and a second conductor electrically connected thereto, the second conductor being formed on the first conductor but separated therefrom by an insulating film. An energy beam is simultaneously radiated on the first and second conductors, as required, simultaneously electrically disconnecting the first conductor from the semiconductor device and electrically connecting the second conductor to the semiconductor device The first conductor comprises a pair of semiconductor regions of a second conductivity type which are formed in a surface layer of a semiconductor substrate of a first conductivity type with a predetermined distance therebetween, and a semiconductor region of the first conductivity type which is interposed between the pair of semiconductor regions of the second conductivity type. The second conductor comprises, for example, a polycrystalline silicon layer, a silicide layer, or an aluminum layer. The energy beam may be, for example, a laser beam or an electron beam. If the laser beam is radiated, an impurity in the eemiconductor regions of the second conductivity type is diffused in the semiconductor region of the first conductivity type. Therefore the pair of semiconductor regions are electrically connected.

In the semiconductor device with the above arrangement, one laser beam radiation operation allows simultaneous disconnection of the second conductor and conduction of the first conductor, resulting in an efficient switching operation.

BRIEF DESCRIPTION OF THE DRAWINGS

Other objects and advantages of the present invention will become apparent from the following description taken in connection with the accompanying drawings in which:

FIG. 1 is a block diagram of a semiconductor device according to the present invention;

FIG. 2 is a plan view of a switching element according to a first embodiment of the present invention;

FIG. 3 is a sectional view of the switching element along the line III—III in FIG. 2;

FIG. 4 is a sectional view of the switching element on which laser beams are radiated;

FIGS. 5A through 5D are sectional views of a semiconductor substrate for explaining a method for manufacturing a switching element according to the present invention;

DETAILED DESCRIPTION OF THE PREFERRED EMBODIMENTS

Figure 6:
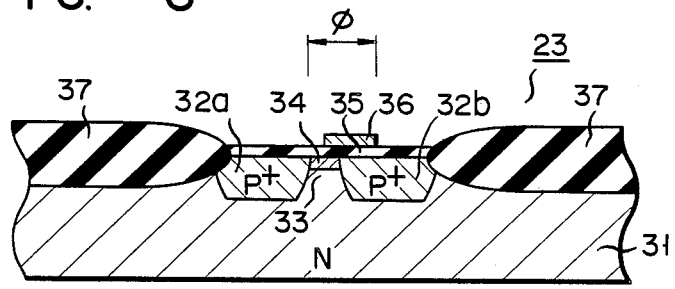
FIGS. 6 and 7 are sectional views of a modification of the switching element shown in FIG. 3.

FIG. 1 is a schematic view of a semiconductor device having a redundancy function according to the present invention. The semiconductor device has a function circuit block 10 which is normally used in the device and a redundancy function circuit block 12 which is used instead of the function circuit block 10 whenever the block 10 is in trouble. The redundancy function circuit block 12 is connected to another function circuit block 14 through a first conductor means 21. The function circuit block 10 is connected to the function circuit block 14 through a second conductor means 22. The first and second conductor means 21 and 22 constitute a switching element 23 for irreversibly switching the function circuit blocks 10 and 12.

FIG. 2 is a plan view showing the pattern of the switching element 23 described above. FIG. 3 is a sectional view of the switching element 23 along the line III—III in FIG. 2. A pair of p+-type semiconductor regions 32a and 32b are formed in a surface region of an n-type silicon semiconductor substrate 31 with a predetermined distance therebetween. The pair of semiconductor regions 32a and 32b and a local region 33 of the semiconductor substrate 31 interposed therebetween constitute the first conductor means 21. An n+-type semiconductor region 34 in which an n-type impurity is diffused to a concentration higher than that of the semiconductor substrate 31 is formed in the surface layer of the local region 33 of the semiconductor substrate 31. Hydrogen ions are injected in advance in the vicinity of the semiconductor region 34 to increase crystal lattice defects. An impurity-doped polycrystalline silicon layer 36 is formed on a silicon oxide film 35 which separates it from the semiconductor region 34. The polycrystalline silicon layer 36 constitutes the second conductor means 22. The silicon oxide film 35 and the polycrystalline silicon layer 36 extend over the pair of semiconductor regions 32a and 32b, as shown in FIG. 3. A field insulating film 37 is formed around the switching element 23.

In the semiconductor device with the above arrangement, the pair of semiconductor regions 32a and 32b are electrically disconnected from each other by the n-type local region 33. Further, since the n+-type semiconductor region 34 is formed as described above, an inversion layer is not formed between the pair of semiconductor regions 32a and 32b even if a normal voltage is applied to the polycrystalline silicon layer 36. Therefore, the semiconductor regions 32a and 32b may not be electrically connected. Meanwhile, the polycrystalline silicon layer 36 is formed continuously and has a low electrical resistance due to the diffused impurity. Therefore, the second conductor means 22 is electrically connected. In this state, the function circuit block 10 is connected to the function circuit block 14 through the switching element 23, while the redundancy function circuit block 12 is electrically disconnected from the function circuit block 14.

Assume that the function circuit block 10 normally used in the device is inoperative and that the redundancy function circuit block 12 is used. A region 50 represented by the broken line in FIG. 2 is locally heated. A second harmonic Nd:YAG laser beam having a wavelength of 5,320 Å and energy density of about 8μ Joules is pulsated and radiated onto the region 50 for several nanoseconds to several microseconds. The polycrystalline silicon layer 36 is heated to a temperature of above about 1,400° C. which is the melting point of polycrystalline silicon. As a result, part of the polycrystalline silicon layer 36 is melted and electrically disconnected (FIG. 4). At such a high temperature, the p-type impurity is diffused from the pair of p+-type semiconductor regions 32a and 32b to the semiconductor substrate 31. Thus, the semiconductor regions 32a and 32b are connected to form the single p+-type semiconductor region 32, as shown in FIG. 4. Many crystal lattice defects in the semiconductor region 34 permit ready joining of the semiconductor regions 32a and 32b.

Upon radiation of the laser beam, the first conductor means 21 electrically connects the function circuit block 12 to the function circuit block 14, while the second conductor means 22 electrically disconnects the function circuit block 10 from the function circuit block 14. Therefore, the function circuit block 12 is connected to the function circuit through the switching element 23 instead of the function circuit block 10.

In the semiconductor device of the above embodiment, one laser radiation operation allows switching of the wirings, resulting in effective switching operation of the wirings.

A method for manufacturing the semiconductor device according to the present invention will be described with reference to FIGS. 5A through 5D. Referring to FIG. 5A, a silicon nitride (Si$_3$N$_4$) film 38 of a predetermined pattern is formed on the n-type silicon semiconductor substrate 31. The field insulating film 37 is then formed by the thermal oxidation process, using the silicon nitride film 38 as a mask. As shown in FIG. 5B, the silicon nitride film 38 is removed. Hydrogen ions are implanted using the field insulating film 37 as a mask to increase crystal lattice defects. Thereafter, an n-type impurity is doped into the surface layer of the semiconductor substrate 31 to form the n+-type semiconductor region 34.

As shown in FIG. 5C, the silicon oxide film 35 is then deposited on the surface of the semiconductor substrate 31 to a thickness of about 800 Å. Further, the polycrystalline silicon layer 36 is formed on the oxide film 35 to a thickness of about 3,000 Å.

As shown in FIG. 5D, the silicon oxide film 35 and the polycrystalline silicon layer 36 are selectively etched. Using the residual polycrystalline silicon layer 36, the silicon oxide film 35 and the field insulating film 37 as a mask, the p-type impurity is diffused in the semiconductor substrate 31 to form the pair of p+-type semiconductor regions 32a and 32b. A depth Xj of the junction between the semiconductor regions 32a and 32b in the longitudinal direction thereof is preferably about 1.5 μm. If so, a depth Xy of the junction in the transverse direction thereof is about 1.0 μm. Therefore, if a width l of the polycrystalline silicon layer is 2.5 μm, the distance between the semiconductor regions 32a and 32b is about 0.5 (=2.5−1.0×2) μm. This distance is short enough to combine the semiconductor regions 32a and 32b with the laser beam described above. Thereafter, a silicon oxide film 39 is formed by the CVD method to cover the entire surface of the resultant structure, and contact holes 40a and 40b are formed in the silicon oxide film 39. Aluminum is then deposited on the resultant structure and is patterned to form electrodes 41a and 41b connected to the respective semiconductor regions 32a and 32b.

Figure 7:
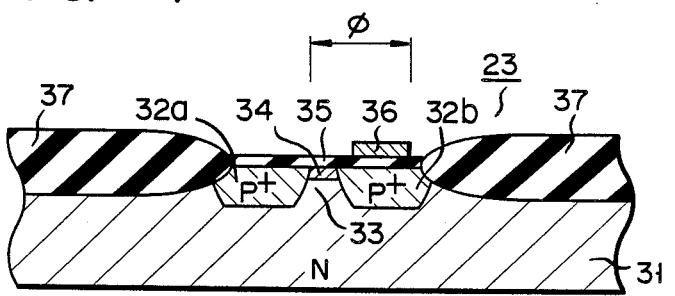

The polycrystalline silicon layer 36 constituting the second conductor means 22 need not be formed directly above the n+-type semiconductor region 34, as shown in FIG. 3. For example, the polycrystalline silicon layer 36 may be formed mainly on the p+-type semiconductor region 32b through the silicon oxide film 35, as shown in FIGS. 6 and 7. In this case, the laser beam must have a beam spot corresponding to at least the diameter φ shown in FIGS. 6 and 7 to fuse the polycrystalline silicon layer 36 and to combine the p+-type semiconductor regions 32a and 32b.

Figure 8:
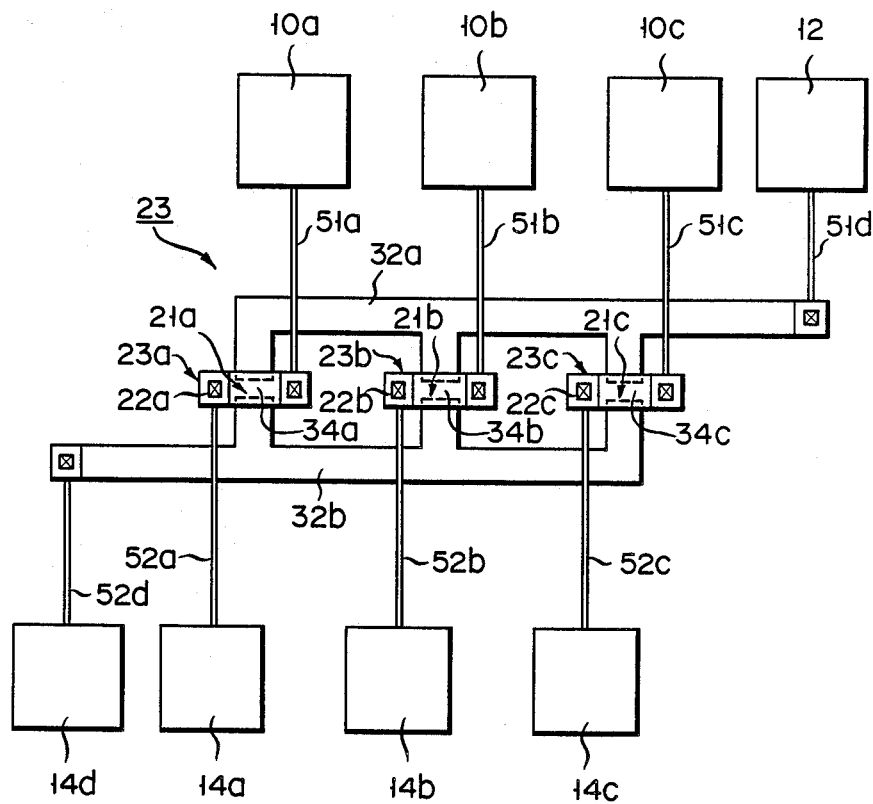
FIG. 8 is a schematic plan view of a switching element according to a second embodiment of the present invention.

FIG. 8 shows a switching element according to a second embodiment of the present invention. The redundancy function circuit block 12 and function circuit blocks 10a, 10b and 10c are connected to the switching element 23. The switching element 23 has a first switching portion 23a connected to the function circuit block 10a, a second switching portion 23b connected to the function circuit block 10b, and a third switching portion 23c connected to the function circuit block 10c. The first switching portion 23a comprises a first conductor means 21a and a second conductor means 22a comprising polycrystalline silicon. The second switching portion 23b comprises a first conductor means 21b and a second conductor means 22b comprising polycrystalline silicon. The third switching portion 23c comprises a first conductor means 21c and a second conductor means 22c comprising polycrystalline silicon. One end of each of the first conductor means 21a, 21b and 21c is connected to the p+-type semiconductor region 32a, while the other end of each of the first wiring means 21a, 21b and 21c is connected to the p+-type semiconductor region 32b. Further, the first conductor means 21a, 21b and 21c have n+-type semiconductor regions 34a, 34b and 34c which are interposed between the p+-type semiconductor regions 32a and 32b, respectively. One end of each of the second conductor means 22a, 22b and 22c is connected to each of the function circuit blocks 10a, 10b and 10c, which are normally used in the device, through each of the Al wirings 51a, 51b and 51c. The other end of each of the second conductor means 22a, 22b and 22c is connected to each of the function circuit blocks 14a, 14b and 14c through each of the Al wirings 52a, 52b and 52c.

The p+-type semiconductor region 32a is connected to the redundancy function circuit block 12 through the Al wiring 51d, while the p+-type semiconductor region 32b is connected to the function circuit block 14d through the Al wiring 52d.

In the switching element 23 with the above arrangement, if one of the function circuit blocks is broken, the broken circuit block is switched to the redundancy function circuit block. For example, if the function circuit block 10a is broken, the second harmonic Nd:YAG laser beam having a wavelength of about 5,320 Å and an energy density of about 8μ Joules is radiated on the switching portion 23a to connect the redundancy function circuit block 12 in place of the function circuit block 10a.

Figure 9:
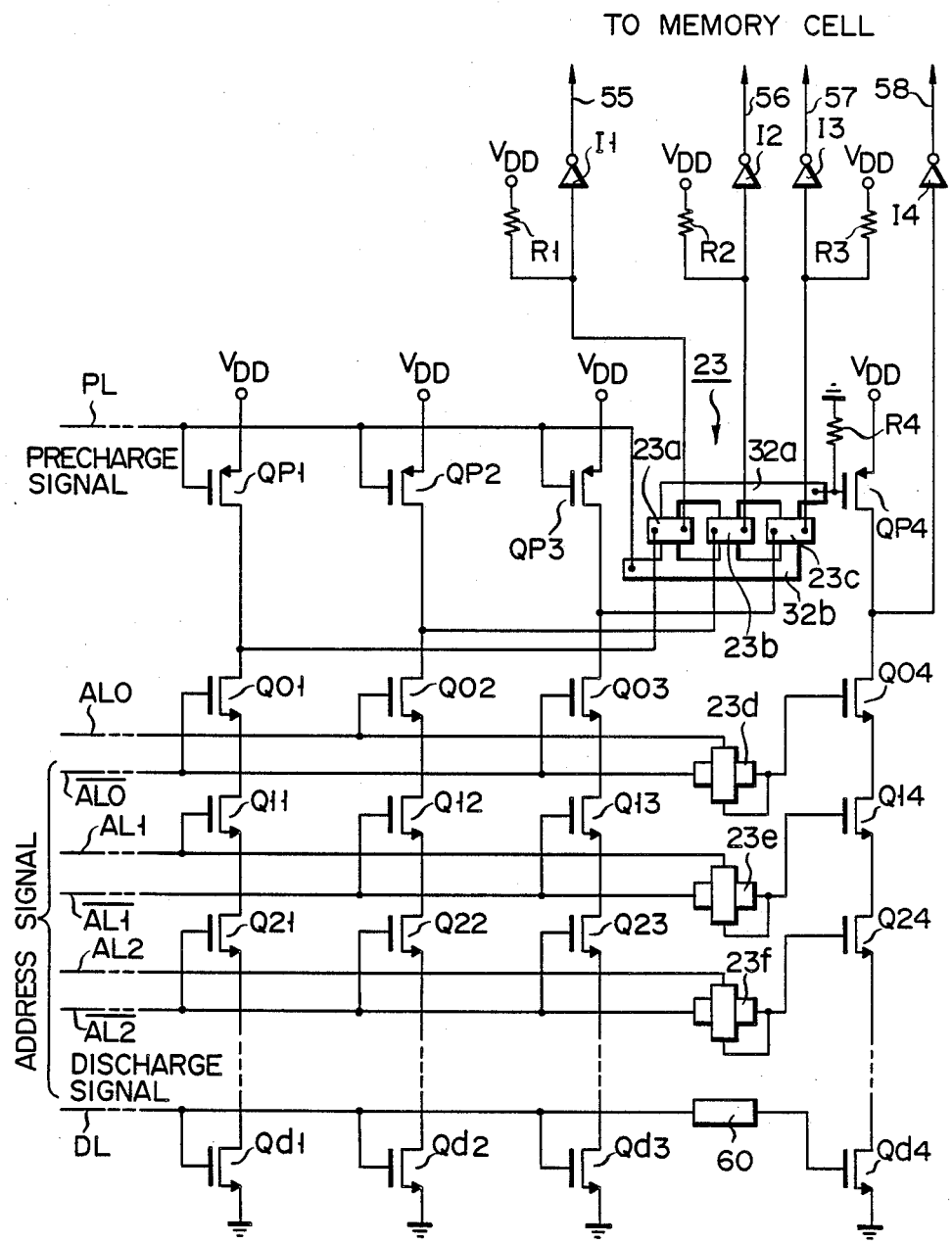
FIG. 9 is a circuit diagram of a decoder used in the switching device according to the present invention.

A row decoder using the switching element according to the present invention will be described with reference to FIG. 9. A precharge control line PL which receives a precharge signal PS is connected to the gate electrodes of p-channel MOS transistors QP1, QP2 and QP3. Address signals A0, A1, A2, ... are supplied to address lines AL0, AL1, AL2, ..., respectively. Inverted address signals $\overline{A0}, \overline{A1}, \overline{A2}, ...$ are supplied to inverted address lines $\overline{AL0}, \overline{AL1}, \overline{AL2}, ...$, respectively. A discharge control line DL which receives a discharge signal DS is connected to the gate electrodes of n-channel MOS transistors Qd1, Qd2 and Qd3. A source of the MOS transistor QP1 is connected to a power source VDD and a drain thereof is grounded through n-channel MOS transistors Q01, Q11, Q21, ..., and Qd1. A source of the MOS transistor QP2 is connected to the power source VDD and a drain thereof is grounded through n-channel MOS transistors Q02, Q12, Q22, ..., and Qd2. The address line AL0 is connected to a gate of the MOS transistor Q02. The inverted address line $\overline{AL0}$ is connected to the gates of the MOS transistors Q01 and Q03. The address line AL1 is connected to a gate of the MOS transistor Q11. The inverted address line $\overline{AL1}$ is connected to the gates of the MOS transistors Q12 and Q13. The inverted address line $\overline{AL2}$ is connected to the gates of the MOS transistors Q21, Q22 and Q23. The drain of the MOS transistor Q01 is connected to the memory cell through the first switching portion 23a, an inverter I1 and a selection line 55. The drain of the MOS transistor Q02 is connected to the memory cell through the second switching portion 23b, an inverter I2 and a selection line 56. The drain of the MOS transistor Q03 is connected to the memory cell through the third switching portion 23c, an inverter I3 and a selection line 57. The switching portions 23a, 23b and 23c constitute the same switching element 23 as that shown in FIG. 8.

In the row decoder described above, a redundancy decoder is connected to the redundancy memory cell through an inverter I4 and a selection line 58. The redundancy decoder comprises the p-channel MOS transistor QP4 and n-channel MOS transistors Q04, Q14, Q24, ..., and Qd4 which are series connected between the power source VDD and the ground. A gate of the MOS transistor QP4 is connected to the p+-type semiconductor region 32a of the switching element 23. The p+-type semiconductor region 32b is connected to the precharge control line PL. A gate of the MOS transistor Q04 is connected to the address line AL0 and the inverted address line $\overline{AL0}$ through a switching element 23d. A gate of the MOS transistor Q14 is connected to the address line $\overline{AL1}$ and the inverted address line AL1 through a switching element 23e. A gate of the MOS transistor Q24 is connected to the address line $\overline{AL2}$ and the inverted address line AL2 through a switching element 23f. A gate of the MOS transistor Qd4 is connected to the discharge line DL through an element 60 which is normally disconnected electrically. The element 60 has the same arrangement as the conventional switching element.

Input ends of the inverters I1 to I3 are connected to the power source VDD respectively through resistors R1 to R3. A gate of the MOS transistor QP4 is grounded through a resistor R4.

In the decoder of the type of the arrangement described above, if the memory cell connected to the selection line 55 is defective, a laser beam is radiated on the switching portion 23a. As a result, the gate of the redundancy MOS transistor QP4 is electrically connected to the precharge line PL. The selection line 55 is connected to the power source VDD through the inverter I1 and the resistor R1, so that the selection line 55 is constantly kept at "L" level. Further, the laser beam is radiated on the switching element 23d, and the gate of the MOS transistor Q04 is electrically connected to the inverted address line $\overline{AL0}$. The gate of the MOS transistor Q14 is electrically connected to the address line AL1 in the same manner as the MOS transistor Q11, so that the switching element 23e need not be switched. Further, the laser beam is radiated on the switching element 23f, so that the gate of the MOS transistor Q24 is electrically connected to the inverted address line AL2.

The laser beam is radiated on the element 60 which is disconnected, and the gate of the MOS transistor Qd4 is electrically connected to the discharge control line DL. Therefore, the redundancy memory cell connected to the selection line 58 is selected. The frequency of laser radiation is decreased as compared with the frequency in the conventional method.

Further, in the decoder of this type, the redundancy MOS transistors Q04, Q14, Q24, ... are first electrically connected to the address lines AL0, AL1, AL2, ..., respectively. The laser beam is radiated only on the switching element to be switched to the inverted address line, and the frequency of laser radiation is decreased.

The element 60 is arranged not to set the selection line 58 to "H" level if the redundancy memory cell need not be used.

Figure 10:
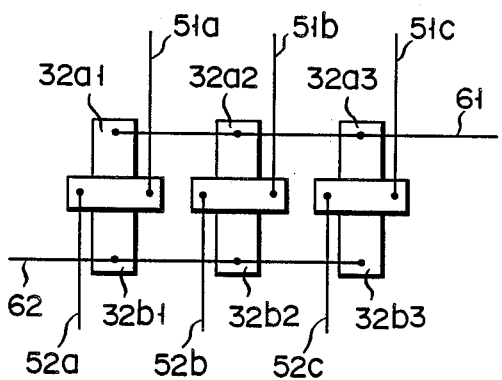
FIG. 10 is a plan view of a modification of the switching element shown in FIG. 8.

FIG. 10 shows a modification of the switching element shown in FIG. 8. Three switching elements are separately formed. The switching elements in FIG. 10 have the same arrangement as the switching element in FIG. 8 except that p+-type semiconductor regions 32a1, 32a2 and 32a3 which constitute the first conductor means are mutually connected by a wiring 61 of aluminum and that p+-type semiconductor regions 32b1, 32b2 and 32b3 are connected by a wiring 62 of aluminum. Therefore, the same reference numerals used in FIG. 8 denote the same parts in FIG. 10, and a detailed description thereof will be omitted. According to the modification described above, if one of the circuits connected to the Al wirings 51a, 51b and 51c is broken, the laser beam is only radiated on the switching portion connected to the broken circuit. Thus, the broken circuit is readily switched to the redundancy function circuit.

The present invention is not limited to the particular applications described above, but can be applied to various kinds of circuits. For example, the semiconductor device according to the present invention may be used to switch frequencies whose signals are supplied to an oscillator circuit. Further, the device may be used to switch waveforms of square wave signals supplied to a multivibrator.

The present invention is not limited to these particular embodiments. For example, other energy beams, such as an electron beam, may be used in place of the laser beam.

The second conductor means 22, 22a, 22b and 22c may comprise another metal or an alloy instead of polycrystalline silicon. In this case, the metal or its alloy must have a melting point lower than that of the silicon oxide film 35, as does aluminum or Al-Si alloy.

In order to increase crystal lattice defects, He, Ne, Ar, Kr, Xe, or Rn ions may be used in place of hydrogen ions.

Obviously, numerous (additional) modifications and variations of the present invention are possible in light of the above teachings. It is therefore to be understood that within the scope of the appended claims, the invention may be practiced otherwise than as specifically described herein.

What we claim is:

1. A method of producing a semiconductor device having first, second, third and fourth circuit means and capable of structurally switching conductivity between said first and second circuit means and between said third and fourth circuit means, comprising the steps of:

introducing an impurity for generating crystal lattice defects in a semiconductor substrate;

producing an N+-semiconductor region by doping said semiconductor substrate with an N-type impurity;

depositing a first silicon oxide film on said semiconductor substrate;

forming a polycrystalline silicon layer on said first silicon oxide film;

selectively etching said first silicon oxide film and said polycrystalline silicon layer;

forming a pair of P+-semiconductor regions having a predetermined distance therebetween which comprises a first conductor means said polycrystalline silicon layer comprising a second conductor means, said first conductor means being connected between said first and second circuit means, and said second conductor means being connected between said third and fourth circuit means;

forming a second silicon oxide film having contact holes on said semiconductor substrate, said contact holes extending to said respective P+-semiconductor regions;

depositing metal on said second silicon oxide film to form electrodes connecting to said respective P+-semiconductor regions through said contact holes; and radiating electromagnetic energy at a predetermined portion of said semiconductor to fuse the polycrystalline silicon layer and to combine the P+-semiconductor regions simultaneously with said fusing to cause said first conductor means to be conductive and said second conductor means to be nonconductive.

2. A method of producing a semiconductor device having first, second, third and fourth circuit means and capable of structurally switching conductivity between said first and second circuit means and between said third and fourth circuit means, comprising the steps of:

providing a semiconductor substrate of a first conductivity type;

introducing an impurity for generating crystal lattice defects in said semiconductor substrate;

forming a first conductor including a pair of first semiconductor regions having a second conductivity type and formed at a predetermined interval in the surface region of said semiconductor substrate; and a second semiconductor region of a first conductivity type being formed between said first semiconductor regions, said first conductor being initially in a nonconductive state and connected between said first and second means;

providing insulation on at least said first conductor;

forming a second conductor on said insulation, said second conductor extending across said first conductor and being electrically conductive in an initial state, said second conductor being connected between said third and fourth circuit means; and radiating electromagnetic energy on at least a portion of said substrate enabling said second conductor means to be electrically disconnected and simultaneously enabling said first semiconductor region to be electrically connected.

* * * * *